US 8,455,043 B2

(12) United States Patent
Chang et al.

(10) Patent No.: US 8,455,043 B2
(45) Date of Patent: Jun. 4, 2013

(54) METHOD OF MAKING TRANSPARENT CONDUCTIVE FILM

(75) Inventors: Young Kyu Chang, Uiwang-si (KR); Seung Yong Bae, Uiwang-si (KR); Young Sil Lee, Uiwang-si (KR); Young Hee Lee, Suwon-si (KR); Hong Zhang Geng, Suwon-si (KR)

(73) Assignee: Cheil Industries Inc., Gumi-si (KR)

( * ) Notice: Subject to any disclaimer, the term of this patent is extended or adjusted under 35 U.S.C. 154(b) by 258 days.

(21) Appl. No.: 12/779,092

(22) Filed: May 13, 2010

(65) Prior Publication Data
US 2010/0218979 A1 Sep. 2, 2010

Related U.S. Application Data

(63) Continuation-in-part of application No. PCT/KR2008/006727, filed on Nov. 14, 2008.

(30) Foreign Application Priority Data

Nov. 14, 2007 (KR) .......................... 10-2007-0116273
Nov. 14, 2008 (KR) .......................... 10-2008-0113264

(51) Int. Cl.
*B05D 5/12* (2006.01)
(52) U.S. Cl.
USPC ............................ 427/122; 427/99.2; 427/337
(58) Field of Classification Search
USPC .......................................... 427/99.2, 122, 337
See application file for complete search history.

(56) References Cited

U.S. PATENT DOCUMENTS 7,060,241 B2 6/2006 Glatkowski
2005/0221016 A1* 10/2005 Glatkowski et al. .......... 427/444
2006/0052509 A1 3/2006 Saitoh
2010/0136224 A1* 6/2010 Britz et al. .................... 427/122
2010/0247820 A1* 9/2010 Krisko et al. .................. 428/34

FOREIGN PATENT DOCUMENTS

KR 10-2004-0030553 A 4/2004
WO WO 2005/113432 * 12/2005
WO 2009/064133 A2 5/2009

OTHER PUBLICATIONS

Geng et al., "Effect of Acid Treatment on Carbon Nanotube-Based Flexible Transparent Conducting Films," Journal of American Chemical Society (2007), vol. 129, No. 25, pp. 7758-7759.
Lee et al., "Dispersion Stability of Single-Walled Carbon Nanotubes Using Naifion in Bisolvent," Journal of Physical Chemistry C (2007), vol. 111, No. 6, pp. 2477-2483.
International Search Report in counterpart International Application No. PCT/KR2008/006727, mailed Jun. 17, 2009.

* cited by examiner

*Primary Examiner* — Brian K Talbot
(74) *Attorney, Agent, or Firm* — Summa, Additon & Ashe, P.A.

(57) ABSTRACT

Disclosed herein is a method of fabricating a transparent conductive film, including preparing a carbon nanotube composite composition by blending a carbon nanotube in a solvent; coating the carbon nanotube composite composition on a base substrate to form a carbon nanotube composite film, and acid-treating the carbon nanotube composite film by dipping the carbon nanotube composite film in an acid solution, followed by washing the carbon nanotube composite film with distilled water and drying the washed carbon nanotube composite film to form a transparent electrode on the base substrate. The transparent conductive film can have excellent conductivity, transparency and bending properties following acid treatment, so that it can be used in touch screens and transparent electrodes of foldable flat panel displays. Further, the carbon nanotube composite conductive film can have improved conductivity while maintaining transparency after acid treatment.

9 Claims, 5 Drawing Sheets

METHOD OF MAKING TRANSPARENT CONDUCTIVE FILM

CROSS-REFERENCE TO RELATED APPLICATIONS

This application is a continuation-in-part of International Application No. PCT/KR2008/006727, filed Nov. 14, 2008, pending, which designates the U.S., published as WO 2009/064133, and is incorporated herein by reference in its entirety, and claims priority therefrom under 35 USC Section 120. This application also claims priority under 35 USC Section 119 from Korean Patent Application No. 10-2007-0116273, filed Nov. 14, 2007, in the Korean Intellectual Property Office, and Korean Patent Application No. 10-2008-0113264, filed Nov. 14, 2008, in the Korean Intellectual Property Office, the entire disclosure of each of which is also incorporated herein by reference.

FIELD OF THE INVENTION

The present invention relates to transparent conductive films formed using a carbon nanotube composite composition and methods of making the same.

BACKGROUND OF THE INVENTION

In recent years, advances in technology for developing a thin and light-weight display have generated a great deal of interest in materials for transparent electrodes.

Transparent conductive films have been generally used in advanced displays such as flat panel displays, touch screen panels, and the like.

For the flat panel displays, a transparent electrode can be formed by coating a metal oxide such as indium tin oxide (ITO) and indium zinc oxide (IZO) on a glass or plastic substrate via a coating process such as sputtering and the like.

The transparent electrode film formed using such a metal oxide has high conductivity and transparency, but also suffers low friction resistance and is vulnerable to bending.

Furthermore, indium adopted as one main material for the transparent film does not allow easy treatment and is very expensive due to limited natural reserves thereof.

Hence, the use of electrically conductive polymers, such as polyaniline, polythiophene, and the like, has been investigated to develop a transparent electrode that exhibits the beneficial properties of the polymers such as easy processibility and bending properties.

A transparent electrode film formed of a conductive polymer can have high electrical conductivity due to doping, good adhesion of a coating layer, and good bending properties.

However, the conductivity of the conductive polymer-based transparent film may not be sufficient for use as a transparent electrode, and the conductive polymer-based transparent film can have low transparency.

Carbon nanotubes have been developed as a material which can be used as a substitute for ITO. Carbon nanotubes are used in many fields. In particular, the use of carbon nanotubes as an electrode material exhibiting excellent electrical conductivity has been actively studied.

Carbon nanotubes are based on carbon and have a tube shape formed by rolling a graphite sheet in a spiral shape. As currently known in the related art, carbon-based materials include diamond, graphite, and fullerene. Compared with these carbon-based materials, carbon nanotubes have a lower density and exhibit higher strength, stability and electrical properties, thereby attracting considerable attention for use in many fields. In particular, the use of carbon nanotubes has been investigated for materials for field emission devices, light emitting devices, displays, and the like using the electrical properties of carbon nanotubes, and also composite materials for use as general materials.

For these applications, attempts have been made to enhance dispersibility and adhesive properties of carbon nanotubes to improve the electrical conductivity of the carbon nanotubes.

However, carbon nanotubes still do not have the conductivity of ITO (several tens of $\Omega/cm^2$).

SUMMARY OF THE INVENTION

In accordance with an aspect of the present invention, a method of fabricating a transparent conductive film is provided. The method of the invention includes: preparing a carbon nanotube composite composition by blending a carbon nanotube in a solvent; coating the carbon nanotube composite composition on a base substrate to form a carbon nanotube composite film; and acid-treating the carbon nanotube composite film to form a transparent electrode on the base substrate by dipping the carbon nanotube composite film in an acid solution, followed by washing the carbon nanotube composite film with distilled water and drying the washed carbon nanotube composite film. The method of the invention can provide a transparent conductive film having enhanced electric conductivity without deteriorating the transparency of the film through surface modification, that is, acid treatment.

In accordance with another aspect of the present invention, a transparent conductive film including a transparent electrode formed of carbon nanotubes on a base substrate is provided. The transparent conductive film is formed using a carbon nanotube composite composition to have enhanced electrical conductivity without deterioration of transparency. The transparent conductive film further can exhibit improved adhesion. The transparent conductive film may also have improved bending properties and can be used as a transparent electrode of a foldable flat panel display.

In exemplary embodiments, the transparent electrode may have a transmittance of 80% or more as measured at a wavelength of 550 nm using a UV/Vis spectrometer. In other exemplary embodiments, the transparent electrode may have a surface resistance of 1000 $\Omega/cm^2$ or less as measured by a 4-point probe method.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

Figure 1:
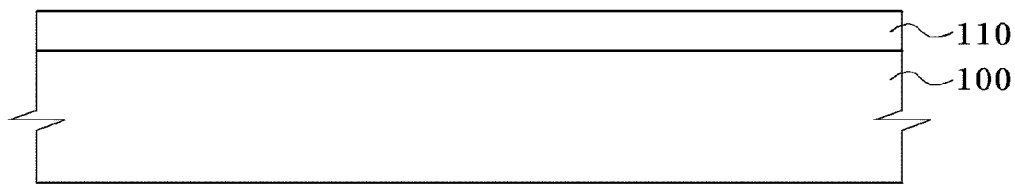
FIG. 1 is a cross-sectional view of a transparent conductive film according to an embodiment of the present invention.

FIG. 1 is a cross sectional view of a transparent conductive film according to an embodiment of the present invention.

Referring to FIG. 1, a transparent conductive film 10 according to the embodiment of the invention includes a base substrate 100 and a transparent electrode 110 formed thereon.

The base substrate 100 may include a polymer film or glass substrate.

The polymer film may be a polyester, polycarbonate, polyether sulfone or acrylate-based transparent film. Exemplary polymers useful for the polymer film include without limitation polyethylene terephtalate (PET), polyethylene naphtalate (PEN), polyether sulfone (PES), and the like, and combinations thereof.

The transparent electrode 110 may be formed by dispersing carbon nanotubes in a mixture solution including one or more solvents, and further including a surfactant or polymer binder to form a carbon nanotube composite composition, and coating the composition on the base substrate 100.

Acid treatment may be performed on the carbon nanotube composite composition to enhance the adhesive force between the base substrate 100 and the carbon nanotubes. The acid treatment will be described in detail below in the following description of an exemplary method of fabricating the transparent conductive film.

Carbon nanotubes can have a very low electric resistance due to inherent structural characteristics thereof, and can have a very long shape.

Carbon nanotubes have been used for many applications, and have been investigated for use in an electrode material due to their superior electrical conductivity.

Exemplary carbon nanotubes include without limitations-ingle-walled carbon nanotubes (SWCNT), double-walled carbon nanotubes (DWCNT), multi-walled carbon nanotubes (MWCNT), and rope carbon nanotubes. In exemplary embodiments of the invention, the carbon nanotube composite composition includes single-walled carbon nanotubes, double-walled carbon nanotubes, or a combination thereof.

According to an exemplary embodiment of the invention, the transparent conductive film comprises at least 90% by weight or more of single-walled or double-walled carbon nanotubes or a combination thereof.

The carbon nanotubes may have an outer diameter of 0.5 to 4 nm and a length of 10 to 5,000 nm. The carbon nanotubes may be refined by a metal catalysis treatment process using a strong acid.

When the carbon nanotubes are coated on the glass substrate or polymer film, the adhesion between the carbon nanotubes can be weakened so as to cause a reduction of electrical conductivity and failure of the electrode.

Thus, after the formation of the transparent conductive film, pressing or over-coating is generally carried out to enhance the adhesion between the carbon nanotubes.

In these cases, however, since thin carbon nanotubes of 100 nm or less in thickness are physically processed, there is a possibility of damaging the surface of the conductive film.

In this invention, the transparent conductive film is fabricated to have good electrical properties without undergoing transparency deterioration through acid treatment in order to enhance the properties of a transparent electrode formed of the carbon nanotubes.

Figure 4:
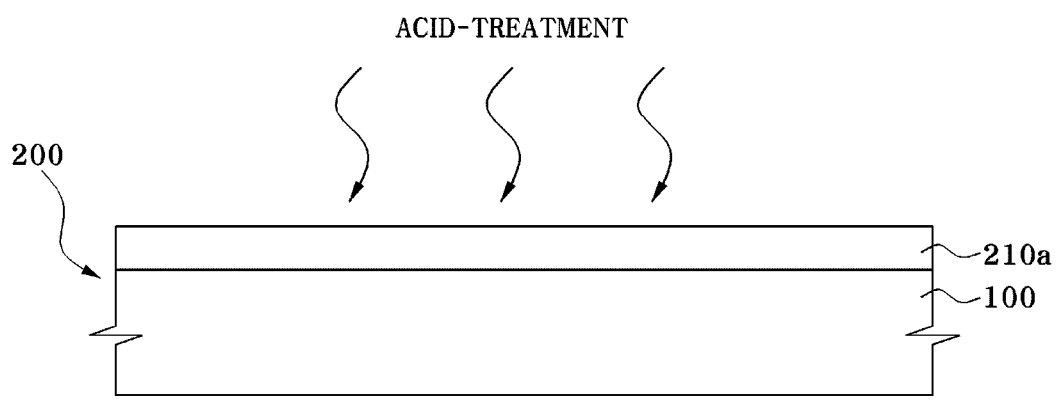
Figure 5:
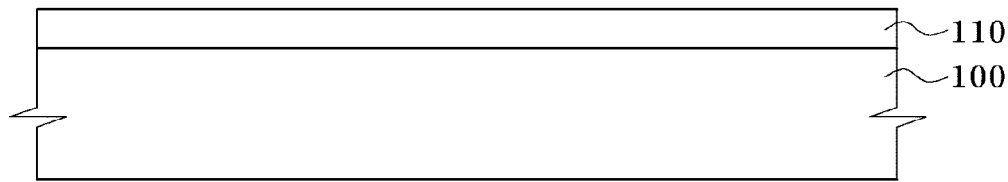
Figure 6:
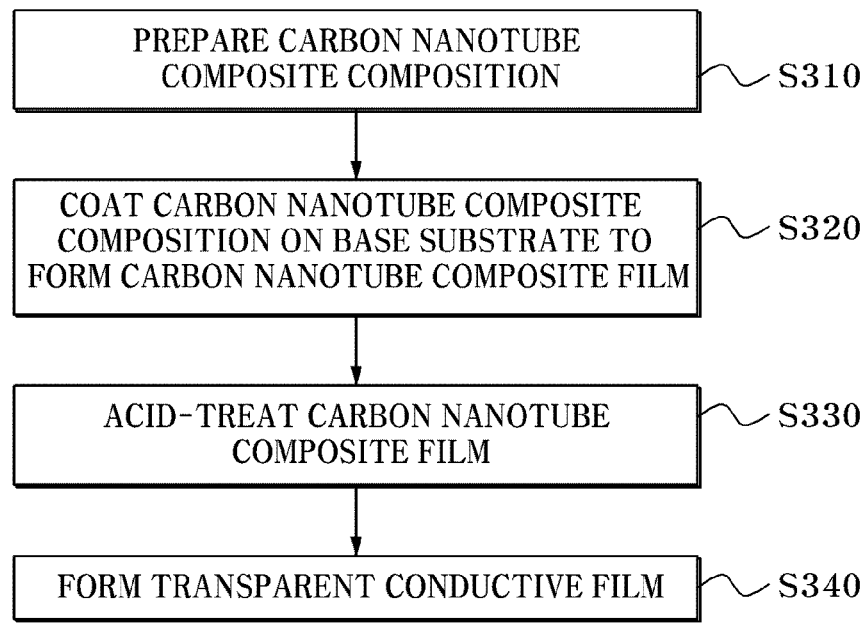
FIG. 6 is a flow chart illustrating the method of fabricating the transparent conductive film according to the embodiment of the present invention.

FIGS. 2 to 5 are diagrams schematically illustrating a method of fabricating a transparent conductive film according to an embodiment of the present invention, and FIG. 6 is a flow chart of the method of fabricating the transparent conductive film according to the embodiment of the present invention.

Herein, the method of the fabrication of the transparent conductive film will be described with reference to the diagrams and the flow chart together.

Figure 2:
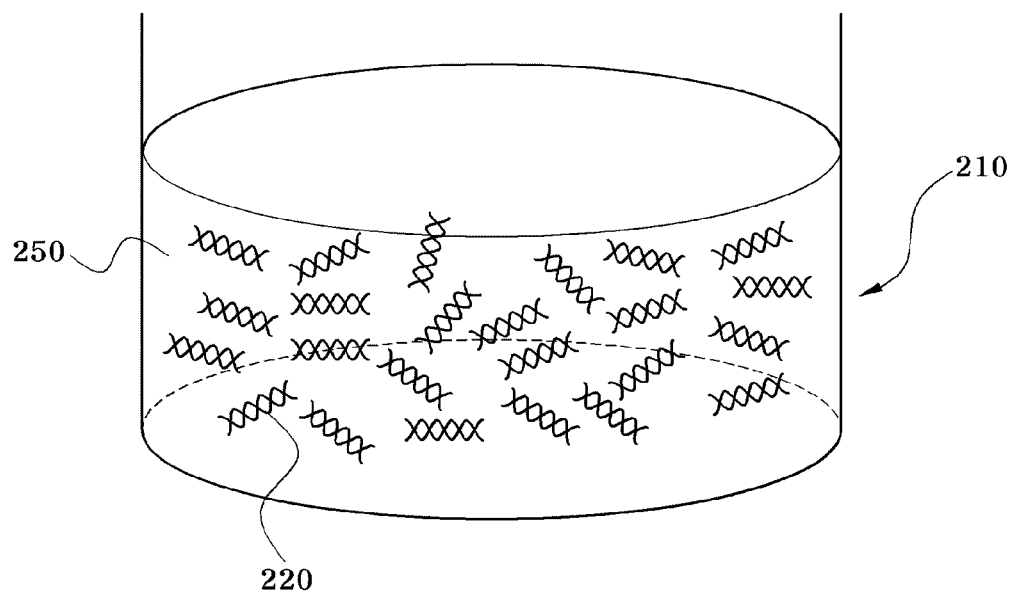
FIGS. 2 to 5 schematically illustrate a method of fabricating a transparent conductive film according to an embodiment of the present invention.

Referring to FIGS. 2 and 6, first, a carbon nanotube composite composition 210 comprising carbon nanotubes 220 is prepared for coating onto a base substrate 100 (see FIG. 3) in order to form a transparent conductive film in operation S310.

According to embodiments of the invention, the carbon nanotube composite composition 210 may be formed by blending the carbon nanotubes 220 with a mixture solution 250.

In a first embodiment of the invention, the mixture solution 250 includes a surfactant and a solvent, and in a second embodiment of the invention, the mixture solution 250 includes a polymer binder and a solvent.

The mixture solution 250 according to the first embodiment may have a composition of 0.01 to 2 parts by weight of the surfactant and 0.01 to 2 parts by weight of the carbon nanotubes, based on 100 parts by weight of the solvent.

The mixture solution 250 according to the second embodiment may have a composition of 0.05 to 1 part by weight of the polymer binder and 0.05 to 1 part by weight of the carbon nanotubes, based on 100 parts by weight of the solvent.

The polymer binder and the carbon nanotubes may be mixed in a ratio of 1:5 to 5:1.

For the mixture solution of the first embodiment, the solvent may be water, which permits a more environmentally friendly preparation.

For the mixture solution of the second embodiment, the solvent may be a mixture of water and isopropyl alcohol prepared by considering solubility of the polymer binder. In this case, the mixture of water and isopropyl alcohol may have a volume ratio of 20:80 to 80:20. In terms of an environmental engineering approach, it is suggested to use water, and when used with water, the solvent may provide high dispersibility of the carbon nanotubes.

According to this embodiment of the invention, the surfactant may be an amphiphilic material containing both a hydrophilic moiety and a hydrophobic moiety. In the solution, the hydrophobic moiety of the surfactant may exhibit affinity for the carbon nanotubes and the hydrophilic moiety of the surfactant may exhibit affinity for water provided as one component of the solvent, which can promote stable dispersion of the carbon nanotubes in the solution.

The hydrophobic moiety may take the form of a long alkyl chain, and the hydrophilic moiety may take the form of a salt, such as sodium salt, potassium salt, or the like.

In this invention, the hydrophobic moiety may have a chain structure including 10 or more carbon atoms, for example 10 to 30 carbon atoms, and the hydrophilic moiety may have either an ionic or non-ionic shape.

Exemplary surfactants include without limitation dodecyl sulfate (SDS), sodium dodecyl benzene sulfonate (NaDDBS), and the like, and combinations thereof.

The polymer binder may include hydrophobic elements while allowing ion conduction or ion exchange.

Although any resin having ionic conductivity or ion exchange properties can be used as the polymer binder, a resin having ionic conductivity can be sensitive to moisture due to its hydrophilic properties and can cause a reduction of the adhesive force after processing.

Accordingly, the resin for the polymer binder of the present invention can include the hydrophobic elements while exhibiting the ionic conductivity or ion exchange properties.

For example, the polymer binder may be a fluorinated polyethylene polymer including fluorine atoms and a sulfonyl functional group, such as the Nafion family of polymers represented by the following Chemical Formula 1:

Chemical formula 1

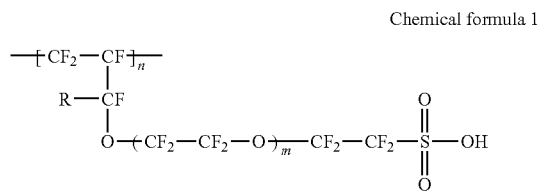

wherein R is a C1-C8 alkyl or a fluorinated C1-C8 alkyl, m is an integer between 0 to 3, and n is the degree of polymerization, for example, in the range of 10 to 10,000, and can be optionally adjusted during polymerization as needed.

As another non-limiting example, the polymer binder may be a thermoplastic polymer that includes one or more functional groups, such as but not limited tocarboxyl, sulfonyl, phosphonyl, and sulfone imides. As yet another non-limiting example, the polymer binder may be a salt of potassium, sodium or the like combined with one or more functional groups such as but not limited to carboxyl, sulfonyl, phosphonyl, and sulfone imides.

The carbon nanotubes 220 have a nano size (shape), forming a large surface area.

As such, since the carbon nanotubes 220 provide a large surface area, the carbon nanotubes 220 can agglomerate and can have a tendency of becoming energetically stable via surface area reduction. In other words, since the carbon nanotubes 200 can agglomerate in the form of a rope and can tend to stabilize due to surface area reduction so as to have a reduced surface energy, the agglomeration of the carbon nanotubes can be minimized when the carbon nanotubes become stable.

Therefore, it can be important to evenly disperse nano-size materials, such as the carbon nanotubes, which exhibit a tendency to agglomerate. A solution of the carbon nanotube composite composition 210 containing the carbon nanotubes 220 can be dispersed by ultrasound dispersion and the like.

Figure 3:
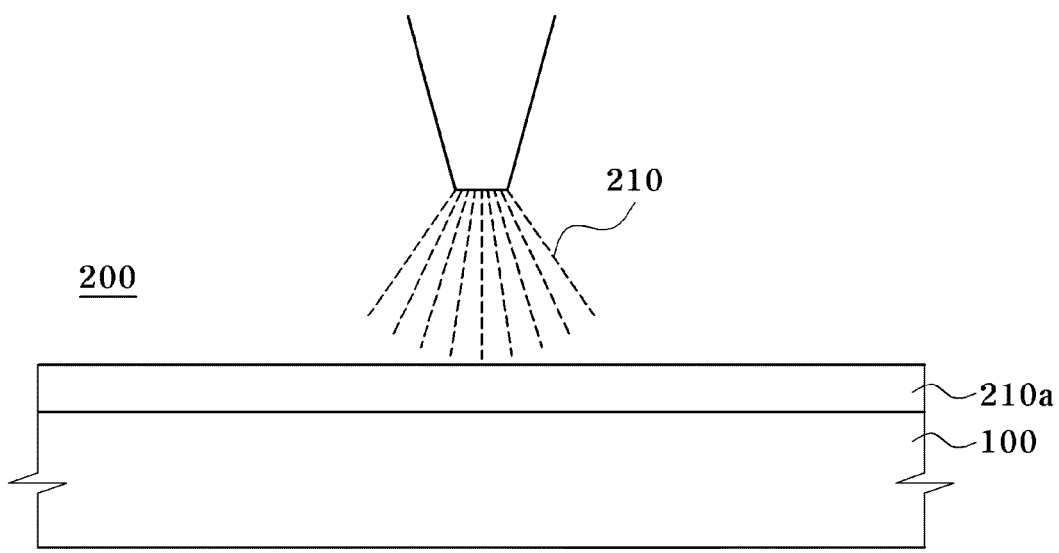

Then, as shown in FIGS. 3 and 6, the carbon nanotube composite composition 210 prepared as in FIG. 2 is coated on the base substrate 100 in operation S320.

Coating of the carbon nanotube composite composition 210 on the base substrate 100 can be achieved by a spray coating process, an ink jet coating process, and the like. The spray coating process may be advantageously used for the coating operation.

In this manner, a carbon nanotube composite layer 210a is formed on the base substrate 100 by coating the carbon nanotube composite composition 210 on the base substrate 100.

As used herein, a substrate having the carbon nanotube composite layer 210a formed on the base substrate 100 will be defined as a carbon nanotube composite film 200.

A polymer film or a glass substrate may be used as the base substrate 100. The polymer film may be a polyester, polycarbonate, polyether sulfone or acrylate-based transparent film. Exemplary polymers useful for the polymer film include without limitation polyethylene terephtalate (PET), polyethylene naphtalate (PEN) and polyether sulfone (PES).

Then, as shown in FIGS. 4 and 6, the carbon nanotube composite film 200 is subjected to acid treatment in operation S330.

For acid treatment, the carbon nanotube composite film 200 may be dipped in an acid solution. In the drawings, the acid treatment is schematically shown for convenience of description.

The acid solution may have a pH of 3 or less, for example a pH in the range of −1 to 1 to exhibit high efficiency. When the acid solution has a pH above 3, suitable acid treatment cannot be performed due to a long acid treatment time.

The acid solution used for the acid treatment may comprise an acid selected from the group consisting of, but not limited to, perchloric acid, nitric acid, hydrochloric acid, sulfuric acid, and mixtures thereof.

During the acid treatment, the carbon nanotube composite film 200 can be dipped in the acid solution for a period of time ranging from 1 minute to 24 hours. For example, the dipping time can range from 30 minutes or more to 5 hours to increase electrical conductivity or to reduce processing time.

Next, the carbon nanotube composite film 200 is removed from the acid, washed with distilled water, and dried.

If the carbon nanotube composite film 200 is made from the combination of the carbon nanotubes, polymer binder and solvent as in the second embodiment described above, carbon nanotubes 220, which may protrude from the surface of the carbon nanotube composite film 200 due to partial detachment of the polymer binder from the surface thereof by the acid treatment, may be conducive to enhancement of conductivity.

Further, the conductivity may be enhanced due to an increase in adhesion area and adhesive force between the carbon nanotubes 220.

If the carbon nanotube composite film 200 is made from the combination of the carbon nanotubes, surfactant and solvent as in the first embodiment, the surfactant remaining after acid treatment may be neutralized or removed to increase purity of the film, thereby enhancing conductivity.

The acid solution used for acid treatment of the carbon nanotube composite layer 210a can reduce a large amount of surfactant present between the carbon nanotube composite layer 210a and the base film 100.

As a result, the carbon nanotube composite layer can be brought into close contact with the base film 100, so that the adhesive force between the carbon nanotube composite layer and the base film 100 can be increased.

As such, the adhesive force between the carbon nanotubes can be increased by removal of the large amount of surfactant present from the film, so that the film has enhanced adhesion and conductivity compared to when a large amount of surfactant remains in the carbon nanotube composite film.

However, a trace of surfactant may remain in the transparent electrode 110 or may be further reduced.

Then, as shown in FIGS. 5 and 6, the carbon nanotube composite film 200 is subjected to acid treatment and drying, thereby forming a transparent conductive film 10 in operation S340.

In exemplary embodiments, the transparent electrode 110 may have a surface resistance of 1,000 Ω/cm² or less as measured by a 4-point probe method. In exemplary embodiments, the transparent electrode 110 may have a transmittance of 80% or more as measured at a wavelength of 550 nm using a UV/Vis spectrometer.

EXAMPLES

Next, examples of the present invention will be described in detail to show that acid treatment of a carbon nanotube composite composition leads to excellent electrical conductivity and adhesive characteristics of a transparent conductive film while maintaining the transparency thereof.

Herein, a description of configuration apparent to those skilled in the art will be omitted for clarity.

1. Preparation of Materials
   1) Carbon nanotubes: Single-walled carbon nanotubes (SAP: purity 60~70%) produced by arc discharge are used. The carbon nanotubes have a length of about 20 μm and a thickness of about 1.4 nm.
   2) Polymer binder: Nafion™ solution DE 520 (5 wt % solution of isopropyl alcohol and water) (commercially available from E.I. Du Pont de Nemours and Company) is used.
   3) Surfactant: Sodium dodecyl sulfate (SDS) (purity 99%) commercially available from Aldrich is used.
   4) Base substrate: Skyrol SH34 PET film commercially available from SK Chemical Co., Ltd is used.

The prepared carbon nanotubes and the polymer binder or SDS are added at a predetermined ratio to a mixture solution of water and isopropyl alcohol mixed in a ratio of 40:60.

Then, the carbon nanotubes in the mixture solution are evenly dispersed by ultrasound dispersion to form a carbon nanotube composite composition, which in turn is coated on a PET film by the spray coating process with different coating numbers, thereby producing a carbon nanotube film.

The carbon nanotube film is dipped in sulfuric acid, nitric acid or a mixture thereof for a predetermined period of time, followed by measuring electrical conductivity and transparency of the carbon nanotube film after washing and drying.

2. Measurement of Electrical Conductivity

To determine the electrical conductivity of the transparent conductive film, four corners of the transparent conductive film are coated with gold so as to form electrodes, and the surface resistance of which is measured in $\Omega/cm^2$ by the 4-point probe method.

3. Measurement of Transmittance

The transmittance of the transparent conductive film is measured at a wavelength of 550 nm with a UV/vis spectrometer with reference to 100 given as a conversion transmittance of the base substrate or glass used for the transparent conductive film.

Herein, the term "transmittance" refers to a degree to which light is transmitted, and is measured in a visible region of 400-800 nm. Herein, to report transmittance measured at a constant wavelength, the transmittance of the film is measured at a wavelength of 400 or 600 nm.

4. Adhesive Force

For the adhesive force of the transparent conductive film, scotch tape is attached to the transparent electrode formed on the PET film, and separated therefrom after a predetermined period of time to determine whether the polymer binder or the carbon nanotubes are stuck or adhered to the separated scotch tape.

The adhesive force of the transparent conductive film to the substrate is indicated by X, Δ, and O after a visual evaluation of whether the film is entirely, partially or not adhered to the scotch tape when the scotch tape is removed (separated from the electrode). Stated differently, "X" indicates that the film is substantially entirely removed from the substrate (i.e., most or all of the film adheres to the tape when the tape is removed from the substrate); "Δ" indicates that the film is partially removed from the substrate (i.e., some of the film adheres to the tape and some the film remains on the substrate when the tape is removed); and "O" indicates that substantially none of the film is removed from the substrate (i.e., the tape is substantially free of film when the tape is removed from the substrate).

5. Analysis of Results

Examples 1-8

After dispersing single-walled CNTs in a solvent prepared using water and SDS or surfactant, ultrasound dispersion is performed to prepare an even dispersion solution. The CNTs and the SDS are present in a ratio of 1:1, and each is dispersed in a density of 0.1 wt % in the solution.

The dispersion solution is coated on the PET film by the spray coating process with different coating numbers, followed by washing with distilled water three times and drying in an oven at 80° C. for 4 hours. The dried film is dipped for 1 hour in 12N nitric acid for acid treatment, followed by washing with distilled water and drying. Then, the electrical conductivity, transparency, and adhesive force of the film are measured.

The same carbon nanotube film is dipped for 1 hour in 12N nitric acid (−1 pH), followed by washing with distilled water and drying. Then, the electrical conductivity and transparency of the film are measured.

Examples 9-14

With single-walled CNTs dispersed in a 40:60 mixture solution of water and isopropyl alcohol, and Nafion™ provided as an ionic conductive polymer, the CNTs are mixed in a ratio of 1:1. Then, the CNTs and the Nafion™ are dispersed to have a density of 0.1 wt % in the solvent, respectively.

The mixture solution is dispersed by the ultrasound dispersion process, and is then coated on the PET film by the spray coating process with different coating numbers, followed by drying at room temperature for 4 hours. The dried film is dipped for 1 hour in 12N nitric acid solution for acid treatment, followed by washing with distilled water. Then, the electrical conductivity, transparency, and adhesive force of the film are measured. The same carbon nanotube film is dipped for 1 hour in 12N nitric acid (−1 pH), followed by washing with distilled water and drying. Then, the electrical conductivity and transparency of the film are measured.

Table 2 shows the deposition (coating) numbers and measurement results.

TABLE 1

|  |  | Example | | | | | | | |
| --- | --- | --- | --- | --- | --- | --- | --- | --- | --- |
|  |  | 1 | 2 | 3 | 4 | 5 | 6 | 7 | 8 |
| Material | | | | | CNT/SDS (1:1) | | | | |
| Coating numbers | | 5 | 7 | 10 | 11 | 12 | 13 | 15 | 16 |
| Transparency (%) | Before acid treatment | 96.2 | 91.5 | 86.3 | 83.5 | 79.1 | 77 | 73.2 | 71.4 |
|  | After acid treatment | 96.1 | 91.3 | 85.9 | 82.8 | 79.2 | 76.8 | 72.6 | 71.5 |

TABLE 1-continued

| | | Example | | | | | | | |
|---|---|---|---|---|---|---|---|---|---|
| | | 1 | 2 | 3 | 4 | 5 | 6 | 7 | 8 |
| Material | | | | | CNT/SDS (1:1) | | | | |
| Coating numbers | | 5 | 7 | 10 | 11 | 12 | 13 | 15 | 16 |
| Resistance ($\Omega/cm^2$) | Before acid treatment | 620 | 390 | 230 | 205 | 150 | 130 | 105 | 96 |
| | After acid treatment | 280 | 170 | 100 | 85 | 65 | 60 | 50 | 42 |
| Adhesive force | | x | x | x | x | X | x | x | x |

From Examples 1 to 8, it can be seen that acid treatment of the film in nitric acid solution led to enhanced electrical conductivity while substantially maintaining transparency of the film before and after the acid treatment.

The degree of conductivity enhancement is about 100%, and there is no difference in adhesive force before and after the acid treatment. However, the use of a suitable binder will increase the adhesive force while enhancing the conductivity.

Further, it could be seen that the conductivity enhanced film maintains conductivity for 30 days or more after which the film reaches a sufficiently stable state.

Figure 7:
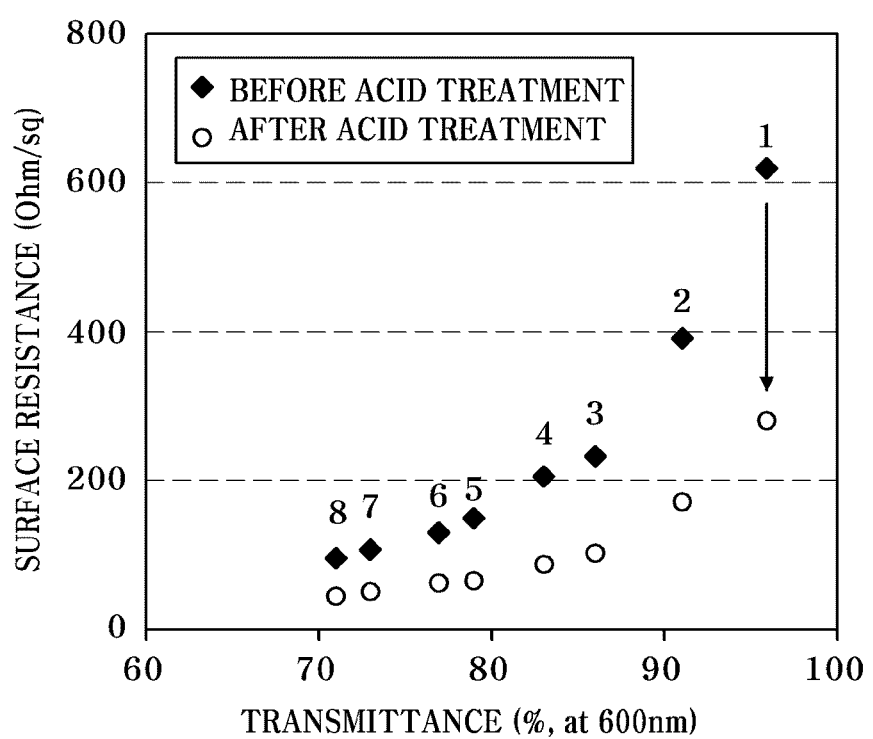
FIG. 7 is a graph illustrating surface resistance and transparency of transparent conductive films of the present invention before and after acid treatment.
Figure 8:
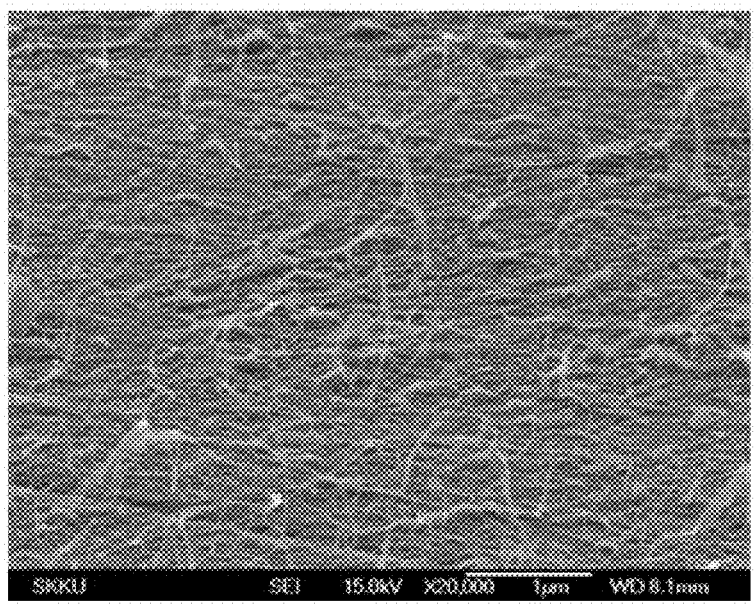
FIGS. 8 and 9 are SEM images of a transparent conductive film of Example 10 before and after acid treatment, respectively.
Figure 9:
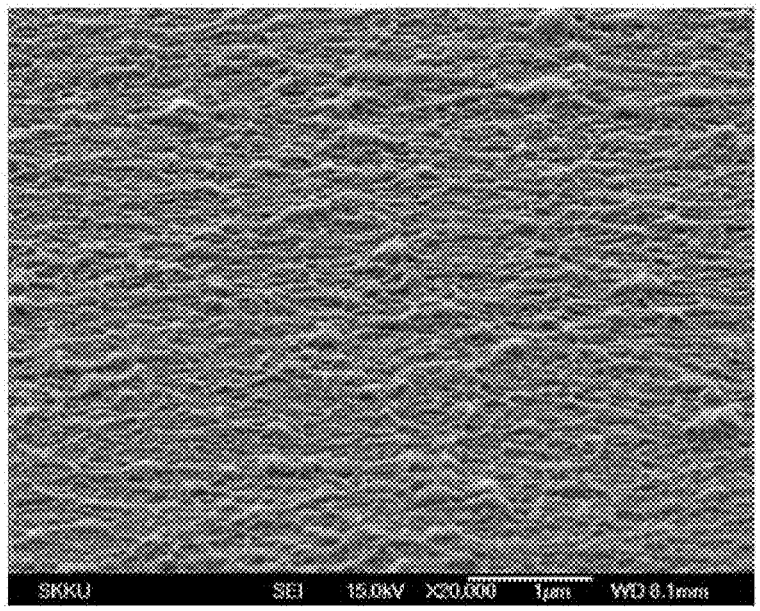

Referring to FIGS. 7, 8, and 9, for the carbon nanotube composite film formed using SDS as the surfactant, the remaining surfactant after acid treatment is neutralized or removed to enhance the conductivity of the film through improvement of purity of the carbon nanotube composite film.

TABLE 2

| | | Example | | | | | |
|---|---|---|---|---|---|---|---|
| | | 9 | 10 | 11 | 12 | 13 | 14 |
| Material | | | | CNT/Nafion (1:1) | | | |
| Coating numbers | | 2 | 5 | 7 | 10 | 15 | 17 |
| Transparency (%) | Before acid treatment | 87.7 | 85 | 84.1 | 82.8 | 72.1 | 68.3 |
| | After acid treatment | 86.3 | 84.8 | 84.5 | 82.6 | 71.5 | 67.8 |
| Resistance ($\Omega/cm^2$) | Before acid treatment | 4500 | 1260 | 1125 | 860 | 220 | 190 |
| | After acid treatment | 1710 | 450 | 473 | 405 | 85 | 80 |
| Adhesive force | | ○ | ○ | ○ | ○ | Δ | ○ |

For Examples 9 to 14, the adhesive force between the PET film and the carbon nanotubes is enhanced by the polymer binder. From Table 2, it can be seen that the conductivity is enhanced by 100% or more while the transparency is maintained.

FIG. 7 is a graph depicting surface resistance of inventive transparent conductive films according to transparency thereof, and FIGS. 8 and 9 are SEM images of a transparent conductive film of Example 10 before and after acid treatment, respectively.

As shown in Tables 1 and 2, when the carbon nanotube composite film is subjected to acid treatment, there is an effect of highly enhancing the conductivity while maintaining the transparency of the film. Further, as seen from Examples 9 to 14 where the polymer binder is used, the use of the polymer binder enhanced the adhesive force.

Although these results are similar to conductivity enhancement by doping of CNTs with $SOCl_2$ (thionly chloride) as reported by Zhang (*Nano Lett.* 2006, 6, 1880) and Tomanek (*J. Am. Chem. Soc.* 2005, 127, 5125), the inventive examples achieved an effect of more noticeable conductivity enhancement than the reported results. Although not wishing to be bound by any explanation or theory of the invention, such an increase in conductivity is currently believed to be obtained via improvement of the adhesive force between the carbon nanotubes by removal of the surfactant during acid treatment, and obtained from a p-doping effect through CNT oxidation during the acid treatment.

Particularly, the carbon nanotube composite film made from the combination of the carbon nanotubes, polymer binder and solvent has increased attachment area and adhesive force between the carbon nanotubes via the acid treatment, so that not only does the carbon nanotube composite film have improved conductivity, but also exhibits good adhesive properties due to the increased adhesive force between the film and the carbon nanotubes.

Additionally, the acid solution used for the acid treatment causes the base substrate to swell and shrink such that the carbon nanotube composite composition can be brought into close contact with the base substrate, thereby improving the adhesion of the nanotube composite composition.

As apparent from the above description, the method of fabricating the transparent conductive film according to the embodiment of the present invention may minimize damage of the surface of the transparent conductive film, and can improve electrical conductivity without undergoing deterioration of transparency through surface modification, that is, acid treatment.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed That which is claimed is:

1. A method of fabricating a transparent conductive film, comprising:

preparing a carbon nanotube composite composition by blending carbon nanotubes in a solvent, and further adding a polymer binder, wherein the carbon nanotube composite composition comprises 0.05 to 1 part by weight of the polymer binder and 0.05 to 1 part by weight of carbon nanotubes, based on 100 parts by weight of the solvent;

coating the carbon nanotube composite composition on a base substrate to form a carbon nanotube composite film; and acid-treating the carbon nanotube composite film to form a transparent electrode on the base substrate by dipping the carbon nanotube composite film in an acid solution having a pH in the range of −1 to 3, followed by washing the carbon nanotube composite film with distilled water and drying the washed carbon nanotube composite film.

2. The method according to claim 1, wherein the solvent comprises a mixture solution of water and isopropyl alcohol in a volume ratio of 20:80 to 80:20.

3. The method according to claim 1, wherein the polymer binder comprises a resin having ionic conductivity or ion exchange properties, the resin comprising fluorine atoms and at least one functional group selected from carboxyl, sulfonyl, phosphonyl, and sulfone imides.

4. The method according to claim 1, wherein the polymer binder and the carbon nanotube are mixed in a ratio of 1:5 to 5:1.

5. The method according to claim 1, wherein the carbon nanotube composite composition is coated on the base substrate by a spray or ink jet coating process.

6. The method according to claim 1, wherein the base substrate is a polymer film comprising a polyester, polycarbonate, polyether sulfone, or acrylate-based polymer.

7. The method according to claim 1, wherein the base substrate is a glass substrate.

8. The method according to claim 1, wherein the acid solution comprises an acid selected from the group consisting of perchloric acid, nitric acid, hydrochloric acid, sulfuric acid, and mixtures thereof.

9. The method according to claim 1, wherein the carbon nanotube composite film is dipped in the acid solution for 30 minutes to 5 hours.

* * * * *